(12) United States Patent
Kanamori

(10) Patent No.: US 6,426,257 B1
(45) Date of Patent: Jul. 30, 2002

(54) FLASH MEMORY AND MANUFACTURING METHOD THEREFOR

(75) Inventor: Kohji Kanamori, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/552,226

(22) Filed: Apr. 19, 2000

Related U.S. Application Data

(62) Division of application No. 09/225,975, filed on Jan. 5, 1999.

(30) Foreign Application Priority Data

Jan. 7, 1998 (JP) .............................. 10-001690

(51) Int. Cl.⁷ ............................................ H01L 21/336
(52) U.S. Cl. ...................... 438/266; 438/257; 438/261; 438/263; 438/267
(58) Field of Search .............................. 438/266, 257, 438/258, 259, 261, 262, 263, 264, 265, 593

(56) References Cited

U.S. PATENT DOCUMENTS

| | | | |
|---|---|---|---|
| 5,070,032 A | * 12/1991 | Yuan et al. | 438/266 |
| 5,846,861 A | * 12/1998 | Saitoh | 438/258 |
| 6,008,088 A | * 12/1999 | Ueda et al. | 438/257 |
| 6,143,609 A | * 11/2000 | Sato et al. | 438/266 |
| 6,271,091 B1 | * 8/2001 | Park | 438/267 |

FOREIGN PATENT DOCUMENTS

| | | |
|---|---|---|
| JP | 60-177678 | 9/1985 |
| JP | 63-17544 | 1/1988 |
| JP | 6-61505 | 3/1994 |
| JP | 8-51164 | 2/1996 |
| JP | 9-251998 | 9/1997 |

* cited by examiner

*Primary Examiner*—Tuan H. Nguyen
*Assistant Examiner*—Jack Chen
(74) *Attorney, Agent, or Firm*—Hutchins, Wheeler & Dittmar

(57) ABSTRACT

In a flash memory that has a floating gate, a control gate, and an erase gate that are all mutually insulated, in which data erasing is performed by extracting electrons from the corner edge of the floating gate to the erase gate via an insulation film, the insulation film between the floating gate and the erase gate is formed so as to have a uniform thickness at its corner part.

7 Claims, 8 Drawing Sheets

(a)

(b)

(c)

(d)

(e)

(f)

(g)

(h)

FLASH MEMORY AND MANUFACTURING METHOD THEREFOR

CROSS REFERENCE TO RELATED APPLICATIONS

This application is a divisional of U.S. patent application Ser. No. 09/225,975 filed Jan. 5, 1999 (pending).

BACKGROUND OF THE INVENTION

1. Field of the Invention

The present invention relates to flash memory, which is a non-volatile semiconductor memory device, and more specifically to a flash memory that has an erase gate for the purpose of extracting electrons from a floating gate during erasing, and to a manufacturing method therefor.

2. Related Art

In the past, a known flash memory has a control gate for the purpose of performing control during data reading and data writing operations with respect to a floating gate, and also an erase gate, independent from the control gate, for performing erasing of with respect to the floating gate.

The above-noted type of flash memory is shown in the plan view presented in FIG. 3, and the cross-sectional view along the line x—x of FIG. 3 is shown in FIG. 4. In this flash memory, an activated region that is separated by an element separation oxide film 2 is provided on the surface of a p-type substrate 1, and a floating gate 12 is provided at the top of the channel region between a source region 14a and drain region 14b, via an intervening gate insulation film 3. On top of the above-noted structure is provided a linear controls gate 11, which is a word line, via an intervening insulating film 8. An erase gate 13 is provided so as to overlap with the edge of the floating gate 12.

In a flash memory such as noted above, the condition in which data has been written into the memory is a condition in which electrons are injected into the floating gate, and in which the threshold voltage of the memory transistor is high. The erase condition is the condition in which electrons are released from the floating gate, and the threshold voltage is low.

Erasing in this flash memory is performed by utilizing the Fowler-Nordheim (F-N) tunneling current, so as to extract electrons from the corner edge part of the floating gate by the erase gate. As shown in FIG. 5, if the potential of the erase gate 13 is made high, an electronic field that is shown by the electrical force lines 21 is generated in an insulation film 10 that is between the floating gate 12 and the erase gate 13 (this film hereinafter being referred to simply as the FG-EG insulation film).

Compared to a location at which the insulation film is parallel, at the corner edge 15 of the floating gate 12 there is a concentration of the electrical field as shown in FIG. 5, the result being that there is a reduction in the effective thickness of the insulation film, this enabling a tunneling phenomenon to occur through the edge 15 part, whereby electrons migrate from the floating gate 12 to the erase gate 13.

When performing operations other than erasing, such as reading and writing, although the potential of the erase gate decreases, because at the curved part 16 of the opposing gate surface from the edge because the electrical field is in fact even weaker than at the parallel part 17 of the FG-EG insulation film, ideally there is no electron flow through the edge 15, and there is also no flow of electrons through the parallel part 17. That is, the erase gate functions as a gate for only erasing.

An FG-EG insulation film of the past was formed by thermal oxidation of the floating gate, which is formed from polysilicon. However, the silicon oxide film that is formed by this thermal oxidation, as shown in FIG. 6, usually has an edge at which the film thickness is small. When the edge part becomes thin, the floating gate potential is caused to rise by operations other than erasing, so that when, for example, performing readout, electrons are ejected through the thin edge part, this leading to the problem of changing to the data writing condition (which is known as the disturb effect).

If an attempt is made to form a thick thermally oxidized film, because of the resulting rounding of the edge at the corner of the floating gate, there is the problem of a lowering of the concentration of the electric field during erasing, so that erasing is insufficient.

Accordingly, it is an object of the present invention to provide, in consideration of the above-noted drawbacks in the prior art, a flash memory and a manufacturing method therefor which reduce the above-described disturb effect and provide a flash memory having long-term reliability.

SUMMARY OF THE INVENTION

The present invention is a flash memory which is provided with a floating gate, a control gate, and an erase gate, said gates being mutually insulated from one another, in which the erasing of data is performed by extracting electrons from an edge of a corner of said floating gate via an insulation film, into said opposing erase gate, wherein said insulation film between said floating gate and said erase gate having a uniform thickness at a corner part of said floating gate.

It is desirable that the above-noted floating gate be made of polysilicon, and that the above-noted FG-EG insulation film be made of either a silicon oxide film or a silicon oxide nitride film.

Another aspect of the present invention is a method for manufacturing a flash memory which is provided with a floating gate, a control gate, and an erase gate, said gates being mutually insulated from one another, in which the erasing of data is performed by extracting electrons from an edge of a corner of said floating gate via an insulation film, into said opposing erase gate, said method comprising the steps of: forming said floating gate which is made of polysilicon and exposing a corner surface of said floating gate; and forming a silicon oxide film on said floating gate that is processed to a prescribed shape, using a CVD process.

Another aspect of the present invention is a method for manufacturing a flash memory which is provided with a floating gate, a control gate, and an erase gate, said gates being mutually insulated from one another, in which the erasing of data is performed by extracting electrons from an edge of a corner of said floating gate via an insulation film, into said opposing erase gate, said method comprising the steps of: forming said control gate which is made of polysilicon and forming a side wall of said control gate; forming a floating gate which is made of polysilicon by using said side wall as a mask; exposing a corner edge of said floating gate; forming a silicon oxide film having a uniform thickness at a corner part of said floating gate; and forming said erase gate.

Another aspect of the present invention is a method for manufacturing a flash memory including a step of annealing after said step of forming a silicon oxide film on the floating gate, using a CVD process.

Another aspect of the present invention is a method for manufacturing a flash memory including a step of forming a silicon thermal oxide film, after said step of forming a silicon oxide film on the floating gate, using a CVD process.

Another aspect of the present invention is a method for manufacturing a flash memory including a step of performing thermal oxidation in an oxidizing atmosphere that includes a nitrogen compound, after said step of forming a silicon oxide film on the floating gate, using a CVD process.

In a flash memory according to the present invention, because the FG-EG insulation film is formed so as to have a uniform thickness at the corner part thereof, the disturb effect does not occur, and long-term stability is achieved.

FIG. 3 shows a plan view of an example of a flash memory according to the present invention, and FIG. 4 shows a cross-sectional view thereof, along the direction indicated by the x—x line in FIG. 3. In this flash memory, activated region that is separated by an element separation film 2 is provided on the surface of a p-type substrate 1, and a floating gate 12 is provided at the top of the channel region between a source region 14a and drain region 14b, via an intervening gate insulation film 3. On top of the above-noted structure is provided a linear control gate 11, which is a word line, via an intervening insulating film 8. An erase gate 13 is provided so as to overlap with the edge of the floating gate 12.

FIG. 7 is an enlarged view of the corner part of the floating gate. In the present invention, the curved part 16 of the FG-EG insulation film is at a uniform distance from the floating gate, as shown in FIG. 7. Although in the most desirable form is one in which the curved part 16 is a quarter of a circle that has the edge 15 as its center, it is possible to achieve the object of the present invention if the variation in thickness is within 10% and preferably within 5% of a quarter of a circle, under normal operating conditions.

Because if the thickness of the curved part 16 becomes thin, as is shown in FIG. 6, there is a tendency for the disturb effect to occur, this condition is not desirable. However, if the thickness is excessive, such as shown in FIG. 8, there is the problem of difficulty in extracting electrons by the F-N tunneling phenomenon.

In the present invention, it is particularly preferable from the standpoint of its characteristics that the floating gate, the control gate, and the erase gate all be made of polysilicon, and it is preferable that the insulation film between each of the gates be made of either silicon oxide or silicon oxide nitride film.

The material used to form the FG-EG insulation film is preferably silicon oxide or silicon oxide nitride.

In the manufacturing method according to the present invention it is essential that the FG-EG insulation gate be formed by a film-forming method that has high anisotropy. After forming a floating gate by a prescribed process using polysilicon, as was done in the past, and causing the corner part of the floating gate that is opposing with respect to the erase gate to be exposed, in the present invention, a silicon oxide film is first formed on the exposed corner part of the floating gate by using the CVD method. This silicon oxide film can be formed to a thickness that is thinner than the desired thickness using CVD, after which the additional oxidation or the like can be used to achieve the desired thickness. If necessary, it is also possible to perform processes to improve the quality of the film. Next, a typical methods of forming the FG-EG insulation film is described below, in (a) through (d).

(a) Using the CVD method, a silicon oxide film is formed to a desired film thickness. It is preferable that the CVD process used be one that enables the formation of a fine and tight film, and the usual LPCVD (low-pressure CVD) can be used, and it is preferable that HTO (high-temperature CVD oxidation) be used, with a gas mixture of $SiH_4$ and $O_2$ or the like being used as the raw gas, at a temperature of approximately 800° C.

(b) Using the CVD method (and any method can be used), a silicon oxide film of a prescribed thickness is formed, after which it is preferable that annealing be performed at a temperature of 950±100° C. so as to achieve a fine and tight film. The annealing method can be that of processing a large number of substrates at once in an electric furnace, and it is also possible, in place of this usual type of annealing, to use RTA (rapid thermal annealing).

(c) Using the CVD method (and any method can be used), a silicon oxide film is formed to a thickness that is in the range from approximately 70% to less than 100% of the prescribed thickness (this preferably being in the range from 80% to 98%), after which thermal oxidation is performed at a temperature of 950±100° C. so as to form a silicon oxide film up to the desired thickness. In this case, either dry oxidation or wet oxidation can be used. It is also possible to use RTO (rapid thermal oxidation) in place of the usual thermal oxidation method.

(d) Using the CVD method (and any method can be used), a silicon oxide film is formed to a thickness that is in the range from approximately 70% to less than 100% of the prescribed thickness (this preferably being in the range form 80% to 98%), after which thermal oxidation is performed at a temperature of 950±100° C. in an atmosphere that includes a nitrogen compound gas such as $NH_3$ or $N_2$ gas or the like and oxygen, so as to form a nitride film of the prescribed thickness. It is also possible to use RTN (rapid thermal nitridation), which is an RTO method, in an atmosphere that includes a nitrogen compound gas such as $NH_3$ or N2 gas or the like and oxygen.

The thickness of the FG-EG insulation film is usually established as approximately 200 Angstroms, this can be set in accordance with the operating voltage.

PREFERRED EMBODIMENTS

Preferred embodiments of the present invention are described below, with references being made to the relevant accompanying drawings.

Figure 1:
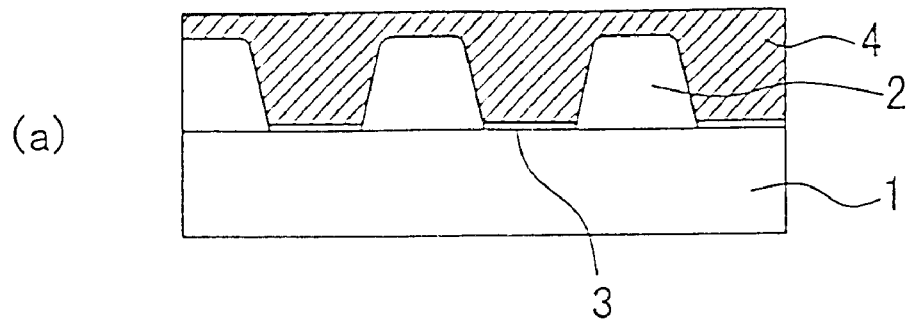
FIG. 1(a)–(c) is a process cross-sectional view that illustrates a method of manufacturing a flash memory according to the present invention.
FIG. 1(d)–(f) is a process cross-sectional view that illustrates the continuation after FIG. 1(a)–(c) of a method of manufacturing a flash memory according to the present invention.
FIG. 1(g)–(h) is a process cross-sectional view that illustrates the continuation after FIG. 1(d)–(f) of a method of manufacturing a flash memory according to the present invention.
Figure 1:
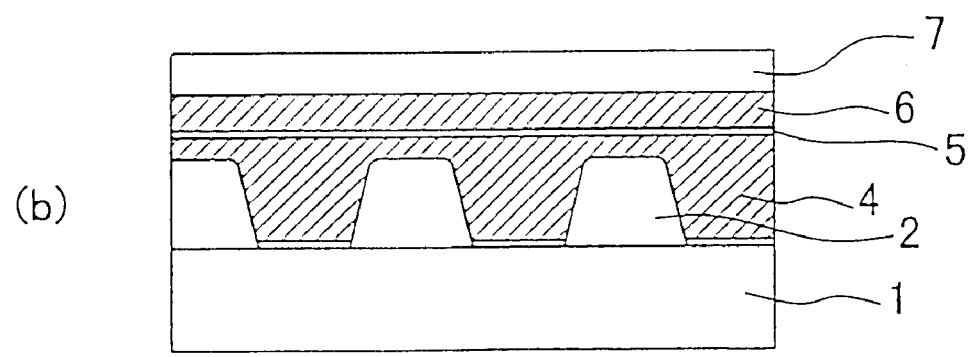
Figure 1:
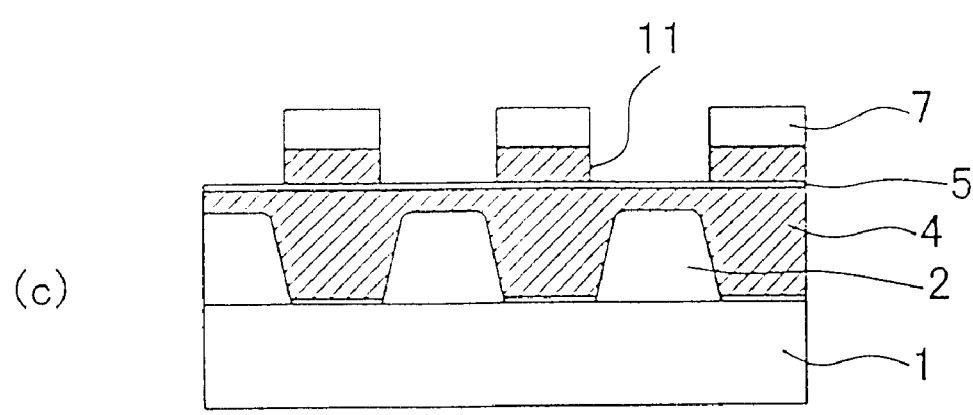
Figure 1:
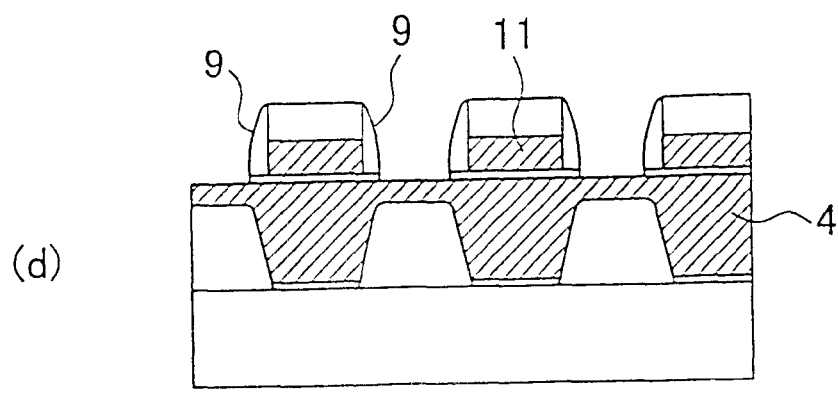
Figure 1:
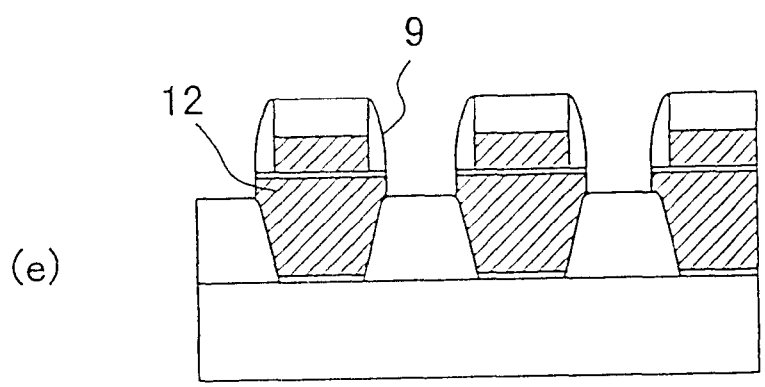
Figure 1:
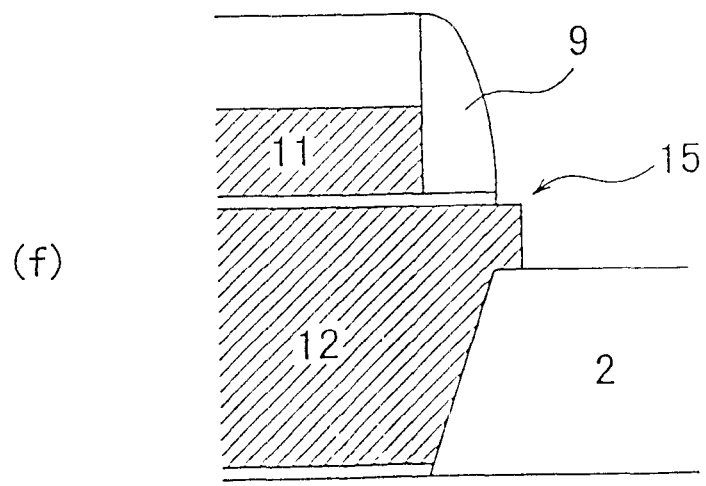
Figure 1:
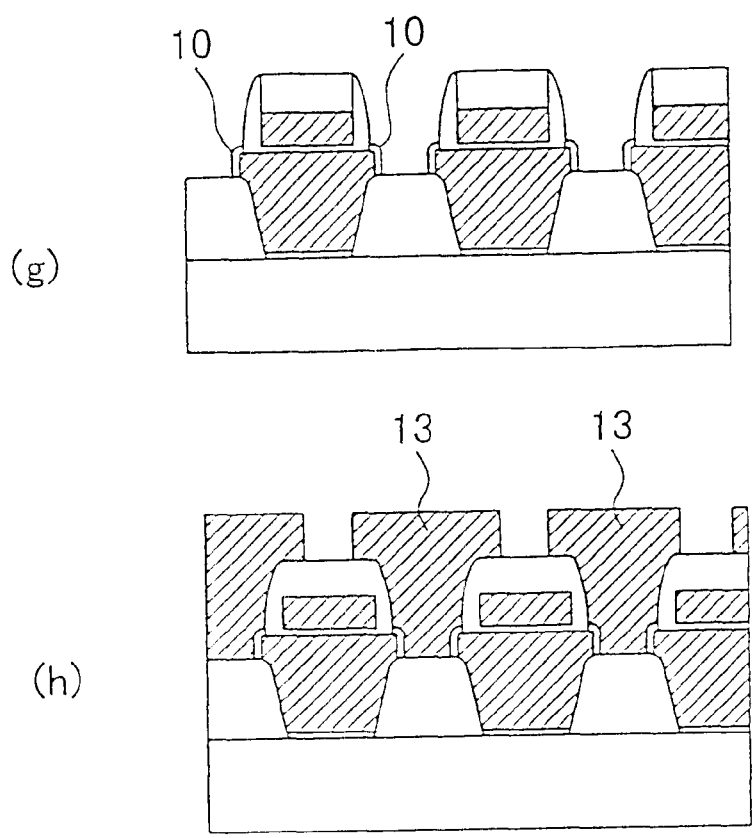
Figure 2:
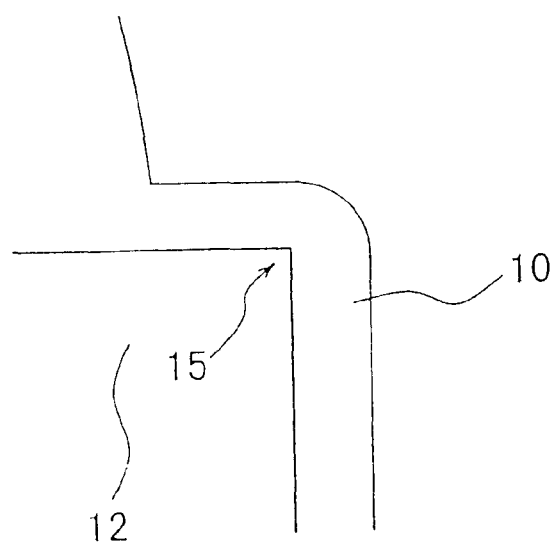
FIG. 2 is an enlarged view of the corner part of a floating gate.
Figure 3:
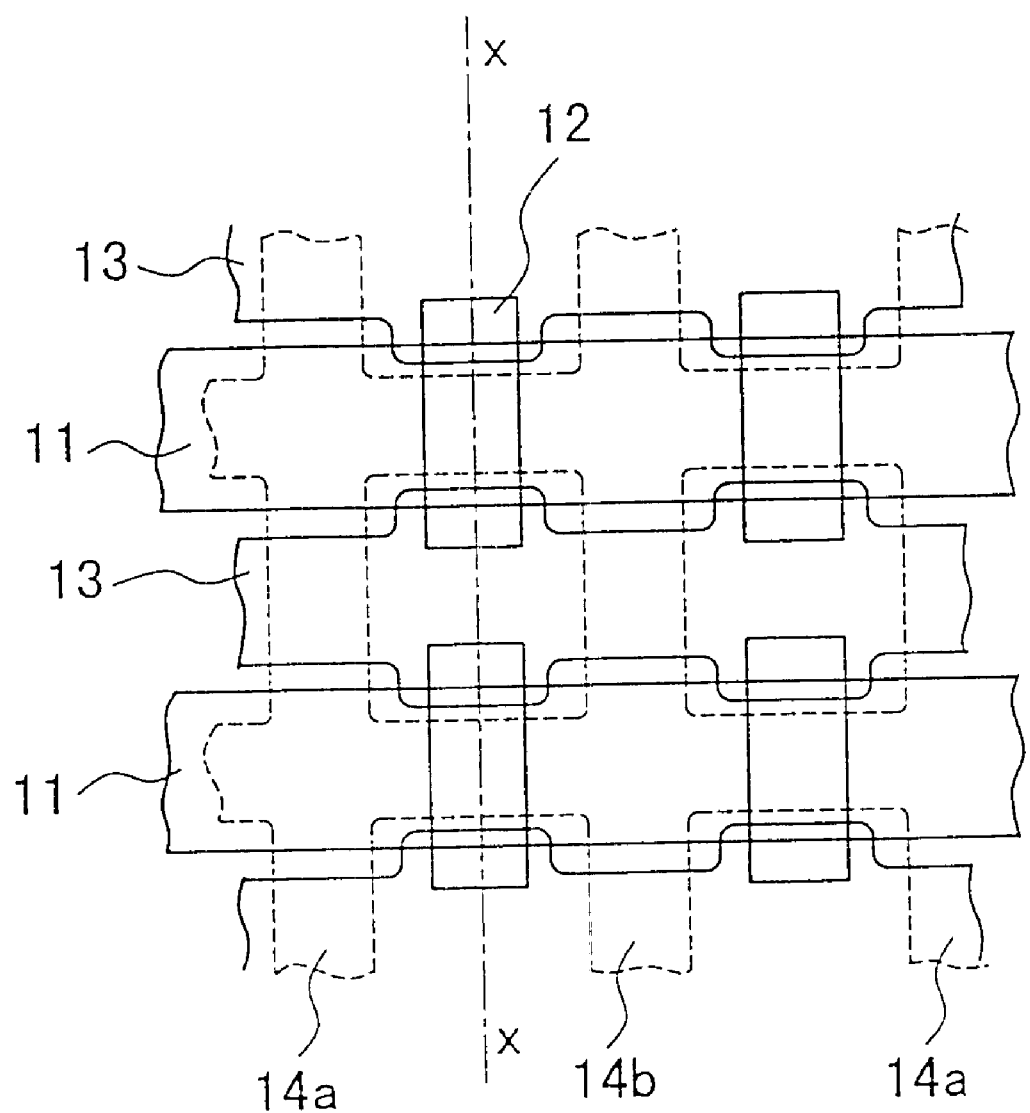
FIG. 3 is a plan view of the structure of a flash memory to which the present invention is applied.

As shown in FIG. 1(a), an activated region formed to approximately 3000 Angstroms is separated by an element separation oxide film 2 on a silicon substrate 2, a gate film 3 being formed on the channel region thereof. Then a polysilicon film 4 is formed so as to fill the space between the element separation oxide film.

Next, as shown in FIG. 1(b), HTO (high-temperature CVD oxidation) is used to form a silicon film to a thickness of 180 Angstroms at 800° C. in an atmosphere of a gas mixture of $SiH_4$ and $O_2$, and further thermal oxidation is done to form the silicon oxide film to a thickness of 300 Angstroms, onto the surface of which is formed a polysilicon film 6 having a thickness of 1500 Angstroms, and onto the surface of this is formed a silicon oxide film 7 having a thickness of 2500 Angstroms, using the CVD method.

Next, as shown in FIG. 1(c), the silicon film 7 and the polysilicon film 6 are etched, using the silicon film 5 as an etching stopper, thereby separating the polysilicon film 6 and forming the control gate 11.

Thereafter, a silicon oxide film is formed over the entire surface using the CVD method, and etching is done so as to form a side-wall oxide film 9 on the side wall of the control gate, as shown in FIG. 1(d).

Next, as shown in FIG. 1(e), the polysilicon film 4 is separated, using the side-wall oxide film 9 as a mask, thereby forming the floating gate 12.

Next, as shown in FIG. 1(f), wet etching or the like is used to etch back approximately 40 to 100 Angstroms of the oxide film 9, thereby exposing the corner edge 15 of the floating gate 12.

Figure 4:
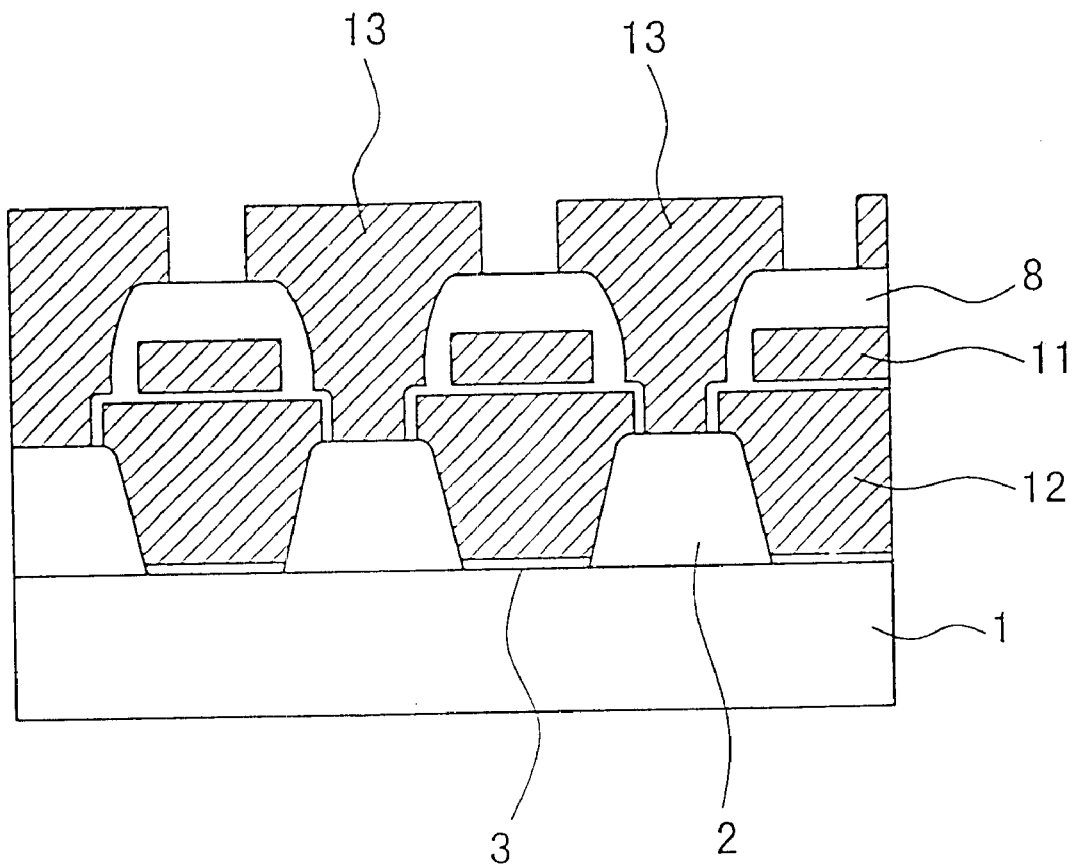
FIG. 4 is a cross-sectional view along the line x—x that is shown in FIG 3.
Figure 5:
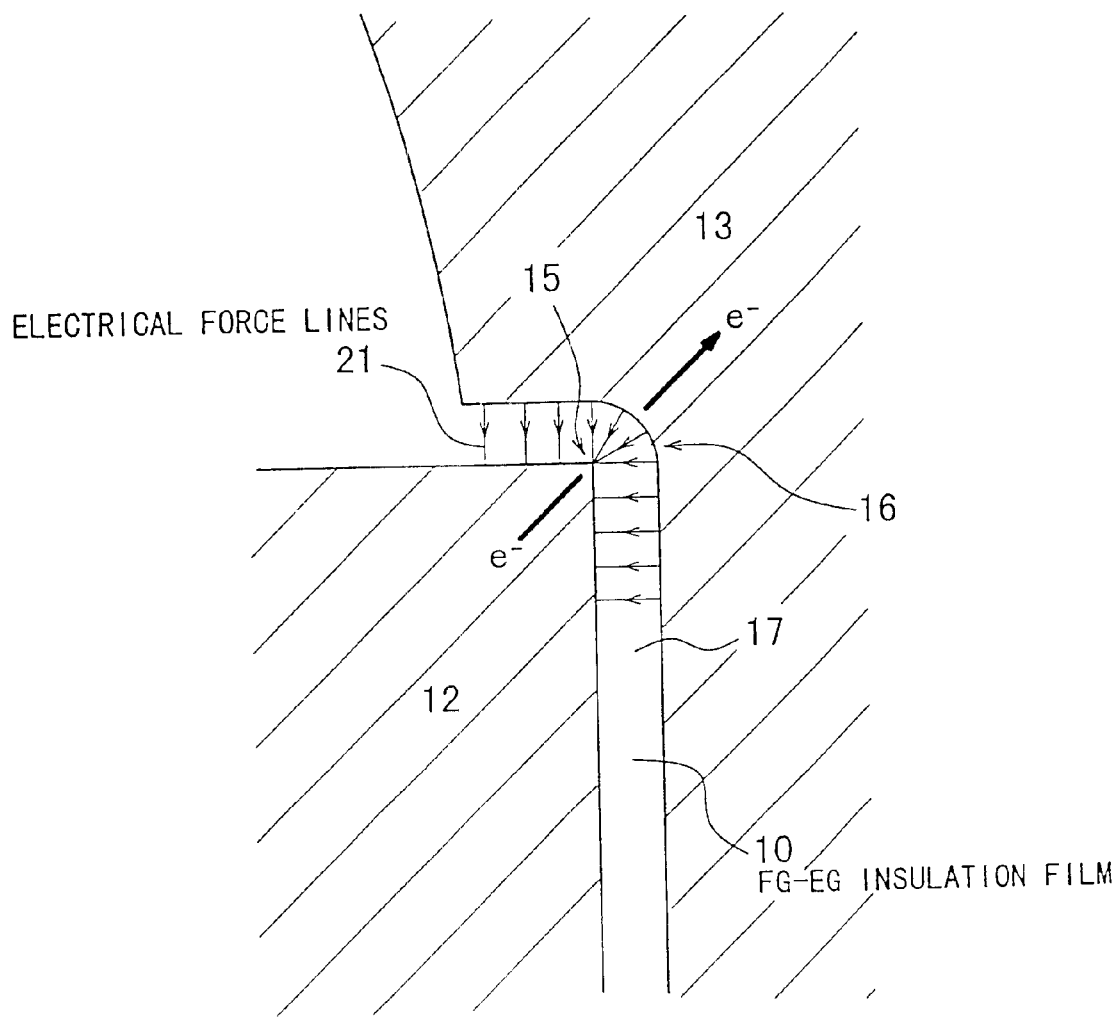
FIG. 5 is a drawing that illustrates a method of erasing data in a flash memory to which the present invention is applied.
Figure 6:
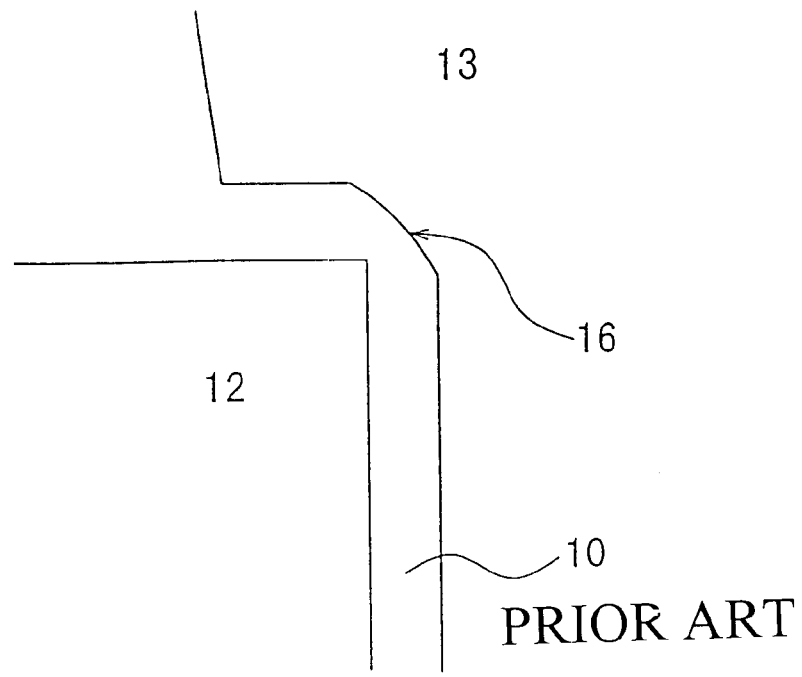
FIG. 6 is an enlarged cross-sectional view which illustrates a flash memory of the past.
Figure 7:
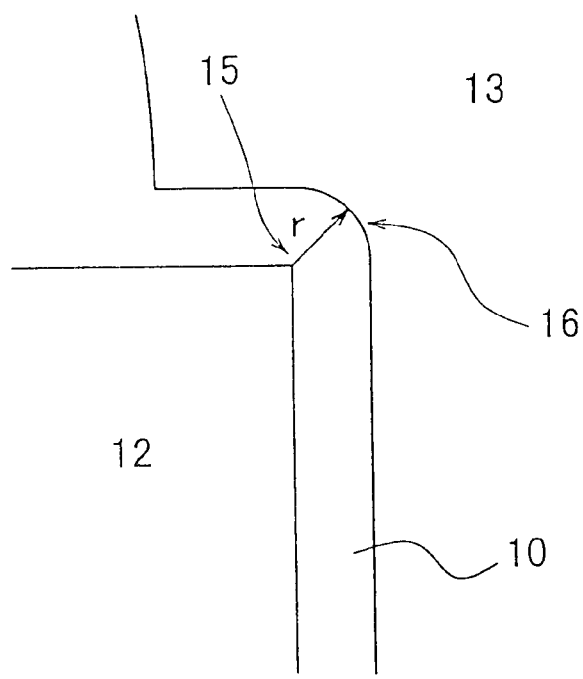
FIG. 7 is an enlarged cross-sectional view which illustrates a flash memory according to the present invention.
Figure 8:
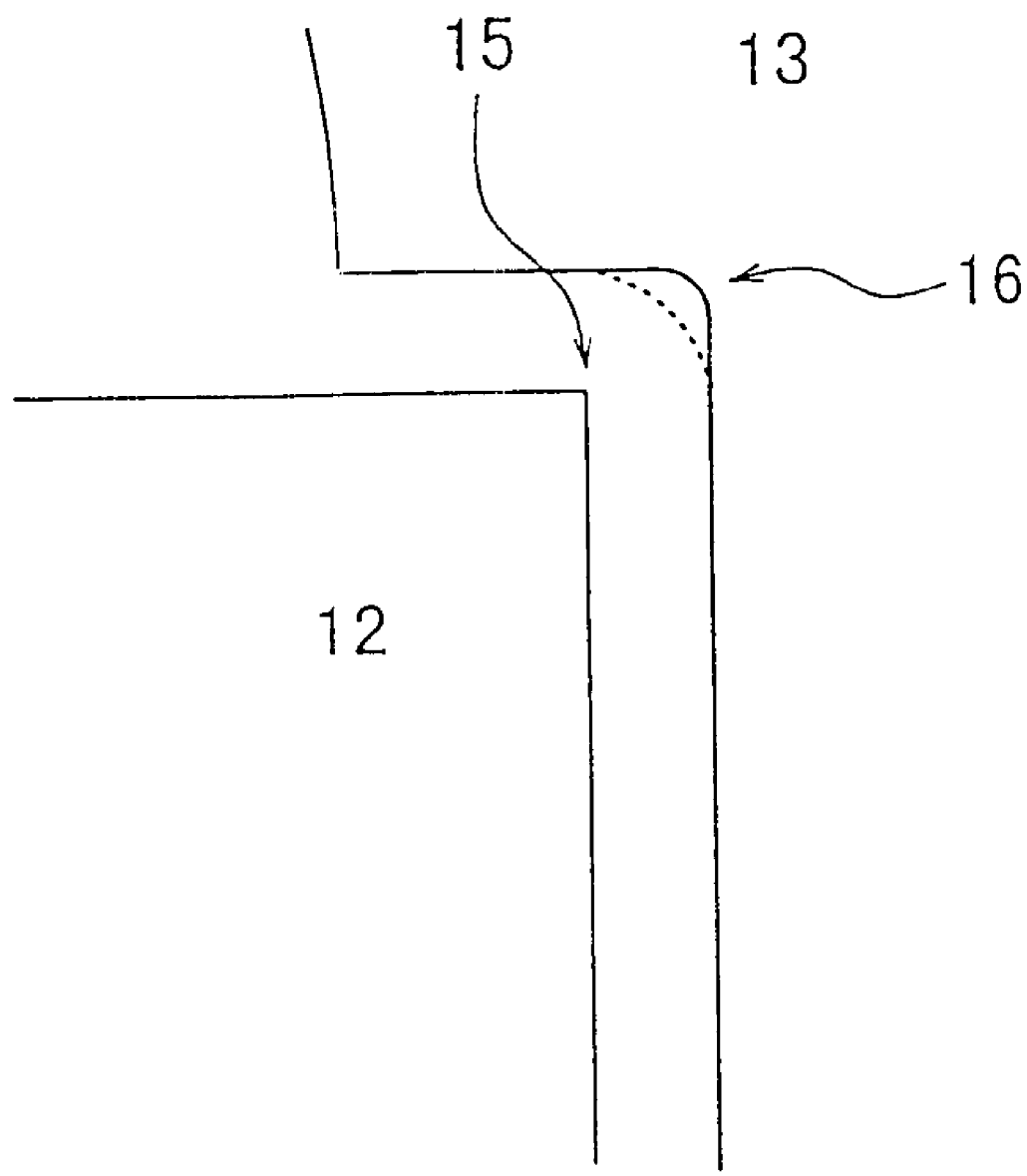
FIG. 8 is an enlarged cross-sectional view which illustrates a flash memory.

Next, as shown in FIG. 1(g), the HTO method is used to form a silicon oxide film to a thickness of approximately 200 Angstroms onto the surface of the floating gate 12, using a gas mixture of $SiH_4$ and $O_2$ or the like at a temperature of approximately 800° C. FIG. 4 is an enlarged drawing of the corner part of the floating gate 13. The FG-EG insulation gate 10 which is formed by the silicon oxide film at the corner part is formed so as to describe an approximate quarter circle with the edge 15 of the floating gate 12 as its center.

Next, as shown in FIG. 1(h), after forming polysilicon, which will serve as an erase gate, onto the entire surface, etching is done to perform separation, thereby forming the erase gate 13.

As described in detail above, because the present invention features a uniform film thickness in the insulation film between the floating gate and the erase gate, the disturb effect is reduced, and a flash memory with long-term reliability is achieved.

What is claimed is:

1. A method of manufacturing a flash memory which is provided with a floating gate, a control gate, and an erase gate, each of said floating gate, said control gate and said erase gate being mutually insulated from one another, in which erasing of data is performed by extracting electrons from an edge of a corner of said floating gate via an insulation film, into said erase gate, said method comprising the steps of:

forming said float gate which is made of polysilicon and exposing a corner surface of said floating gate;

forming a silicon oxide layer on said floating gate having a uniform thickness at the corner surface of said floating gate, using a CVD process; and forming a silicon thermal oxide film after said forming of said silicon oxide layer on said floating gate using a CVD process.

2. A method of manufacturing a flash memory according to claim 1, further comprising a step of performing thermal oxidation in an oxidizing atmosphere that includes a nitrogen compound, after said step of forming a silicon oxide layer on the floating gate, using a CVD process.

3. The method of claim 1, wherein said corner surface is a curved part having a uniform thickness at a corner of said floating gate.

4. The method of claim 3, wherein said curved part is at a uniform distance from said floating gate.

5. A method of manufacturing a flash memory which is provided with a floating gate, a control gate, and an erase gate, each of said floating gate, said control gate and said erase gate being mutually insulated from one another, in which erasing of data is performed by extracting electrons from an edge of a corner of said floating gate via an insulation film, into said erase gate, said method comprising the steps of:

forming said float gate which is made of polysilicon and exposing a corner surface of said floating gate;

forming a silicon oxide layer on said floating gate having a uniform thickness at the corner surface of said floating gate, using a CVD process; and performing thermal oxidation in an oxidizing atmosphere that includes a nitrogen compound, after said forming of said silicon oxide film on said floating gate using a CVD process.

6. The method of claim 5, wherein said silicon oxide layer at said corner surface forms a curved part that is at a uniform distance from said floating gate.

7. The method of claim 6, wherein said curved part has a top portion opposite said floating gate approximating a quarter circle having a center which is a corner of said floating gate opposite said top portion.

* * * * *